(12) United States Patent
Zarabadi et al.

(10) Patent No.: US 7,616,011 B2
(45) Date of Patent: Nov. 10, 2009

(54) DETECTION APPARATUS FOR A CAPACITIVE PROXIMITY SENSOR

(75) Inventors: Seyed R. Zarabadi, Kokomo, IN (US); Ronald Helmut Haag, Lake Orion, MI (US)

(73) Assignee: Delphi Technologies, Inc., Troy, MI (US)

( * ) Notice: Subject to any disclaimer, the term of this patent is extended or adjusted under 35 U.S.C. 154(b) by 244 days.

(21) Appl. No.: 11/784,036

(22) Filed: Apr. 5, 2007

(65) Prior Publication Data

US 2008/0246495 A1    Oct. 9, 2008

(51) Int. Cl.
G01R 27/26    (2006.01)

(52) U.S. Cl. .................. 324/678; 324/662; 324/519

(58) Field of Classification Search ................ 324/678, 324/679, 658, 76.11, 662, 519
See application file for complete search history.

(56) References Cited

U.S. PATENT DOCUMENTS

| | | | |
|---|---|---|---|
| 6,499,359 B1 | 12/2002 | Washeleski et al. | |
| 6,700,393 B2 | 3/2004 | Haag et al. | |
| 6,723,933 B2 | 4/2004 | Haag et al. | |
| 6,750,624 B2 | 6/2004 | Haag et al. | |
| 6,777,958 B2 | 8/2004 | Haag et al. | |
| 7,119,705 B2 | 10/2006 | Manlove et al. | |
| 2005/0134292 A1* | 6/2005 | Knoedgen | 324/658 |

* cited by examiner

Primary Examiner—Vincent Q Nguyen
(74) Attorney, Agent, or Firm—Jimmy L. Funke

(57) ABSTRACT

A switched capacitance detection circuit is responsive to changes in the fringing capacitance of a capacitive proximity sensor having at least one capacitive sensor element. In cases where the sensor has a single sensor element, the switching frequency of the detection circuit is controlled to maintain measurement accuracy in the presence of sensor moisture while minimizing power consumption and electromagnetic radiation. In cases where the sensor has multiple sensor elements, the capacitance values for each sensor element are differenced, absolute-valued and summed to form an output in which common-mode effects due to sensor moisture, temperature and sensor aging are canceled out.

12 Claims, 5 Drawing Sheets

DETECTION APPARATUS FOR A CAPACITIVE PROXIMITY SENSOR

TECHNICAL FIELD

The present invention relates to a touch-less capacitive sensor in which the proximity of an object to the sensor is detected by a change in the fringing capacitance of the sensor, and more particularly to an apparatus for reliably detecting the change in fringing capacitance.

BACKGROUND OF THE INVENTION

Capacitive proximity sensors have been developed to enable touch-less or non-contacting object detection. For example, the sensor may be configured as an elongate strip and affixed to a moveable panel or the frame of a door or window opening to detect the introduction of foreign objects in the door or window path. Sensors of this type are disclosed in the U.S. Pat. Nos. 6,700,393, 6,723,933, 6,750,624 and 6,777,958 to Haag et al., assigned to Delphi Technologies, Inc., and incorporated herein by reference.

In general, capacitive proximity sensors have two conductive plates and a detection circuit that detects changes in the capacitance between the plates since objects in proximity to the sensor change the intensity of fringing electric fields between the plates. For example, the aforementioned U.S. Pat. No. 6,777,958 discloses a detection circuit in which the sensor capacitance determines the frequency of an RF oscillator, and a detection circuit measures changes in that frequency by mixing the output of the oscillator with a fixed frequency signal and low-pass filtering the result. Regardless of how the change in capacitance is detected, it is important to account for the influence of factors such as sensor moisture, temperature and aging of the sensor materials. Also, it is important to be able to provide multiple sensor elements without incurring the expense of a separate detection circuit for each of the sensor elements. Accordingly, what is needed is an improved detection apparatus that is configured to operate with one or more capacitive proximity sensors and that is insensitive to sensor moisture and other environmental and aging factors that influence the capacitance of the sensor.

SUMMARY OF THE INVENTION

The present invention is directed to an improved detection apparatus responsive to changes in the fringing capacitance of a capacitive proximity sensor having at least one capacitive sensor element. The detection apparatus includes a switched capacitance circuit that samples the fringing capacitance of the sensor element using a pair of non-overlapping timing signals. In cases where the sensor has a single sensor element, the switching frequency of the detection circuit is controlled to maintain measurement accuracy in the presence of sensor moisture while minimizing power consumption and electromagnetic radiation. In cases where the sensor has multiple sensor elements, the capacitance values for each sensor element are differenced, absolute-valued and summed to form an output in which common-mode effects due to sensor moisture, temperature and sensor aging are canceled out.

DESCRIPTION OF THE PREFERRED EMBODIMENT

Figure 1A:
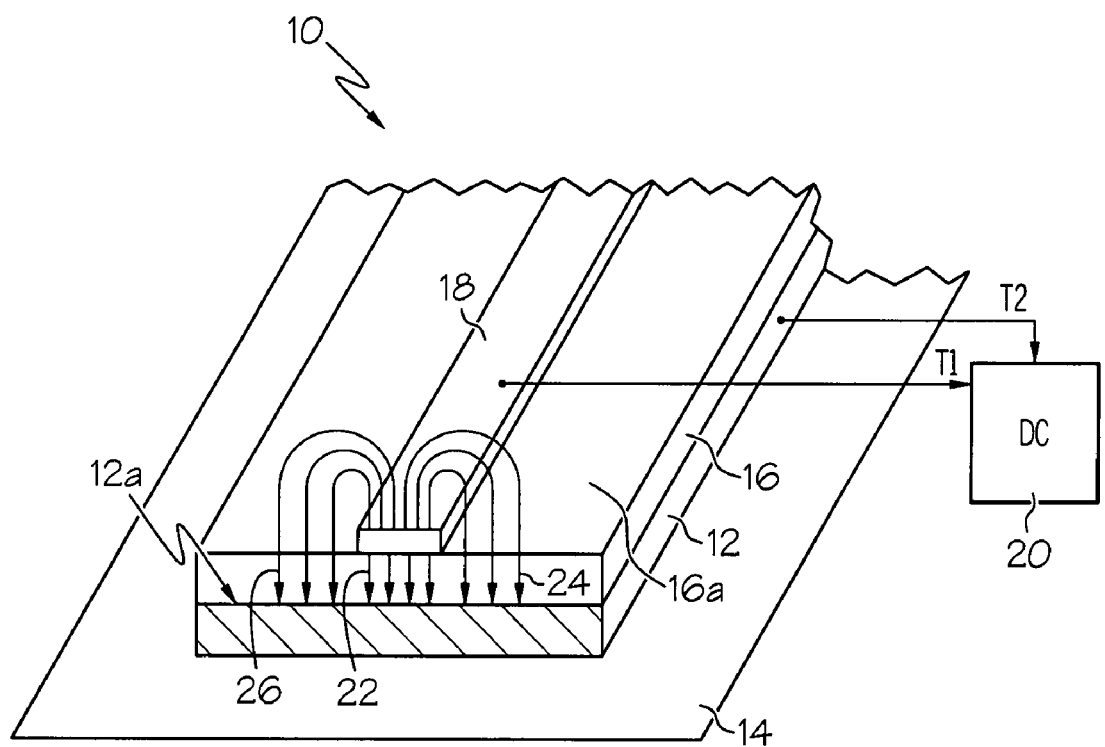
FIG. 1A is a partial cross-sectional diagram of a single element capacitive proximity sensor strip.
Figure 1B:
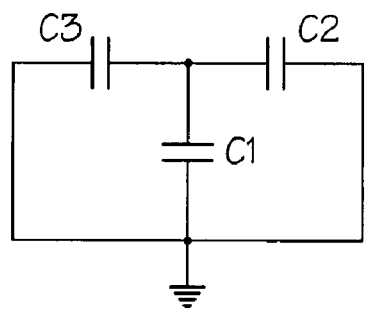
FIG. 1B is an equivalent circuit diagram of the capacitive proximity sensor strip of FIG. 1A.

FIGS. 1A-1B illustrate mechanical and electrical aspects of an elongate single element capacitive proximity sensor strip similar to those disclosed in the aforementioned U.S. patents to Haag et al. In FIG. 1A, the sensor strip is generally designated by the reference numeral 10, and includes a wide flexible conductor 12 affixed to a mounting surface 14, a dielectric layer 16 covering the outboard face 12a of conductor 12, and a narrow flexible conductor 18 centrally disposed on the outboard face 16a of dielectric layer 16. In the illustration, the wide conductor 12 forms the ground plane of the sensor strip 10. If the mounting surface 14 is conductive, it may be used as the ground plane; in this case, the wide conductor 12 can be omitted, and the dielectric layer 16 affixed directly to the mounting surface 14.

A detection circuit (DC) 20 measures the electrical capacitance between narrow conductor 18 and the ground plane (conductor 12 in the illustration), and detects changes in capacitance that occur when an object comes in proximity to the sensor strip 10. Referring to FIGS. 1A and 1B, the measured capacitance includes a direct capacitance C1 associated with the direct electric field lines 22 between conductors 12 and 18, and fringing capacitances C2 and C3 associated with the lateral fringing electric field lines 24 and 26. The capacitances C1, C2 and C3 are in parallel so that the measured capacitance is effectively the sum of C1, C2 and C3. When an object nears the sensor strip 10, the fringing capacitances C2 and/or C3 are altered depending on the location and dielectric constant of the object, and the consequent change in the measured capacitance can be analyzed to infer information about the object and its location relative to the sensor strip 10.

Figure 2:
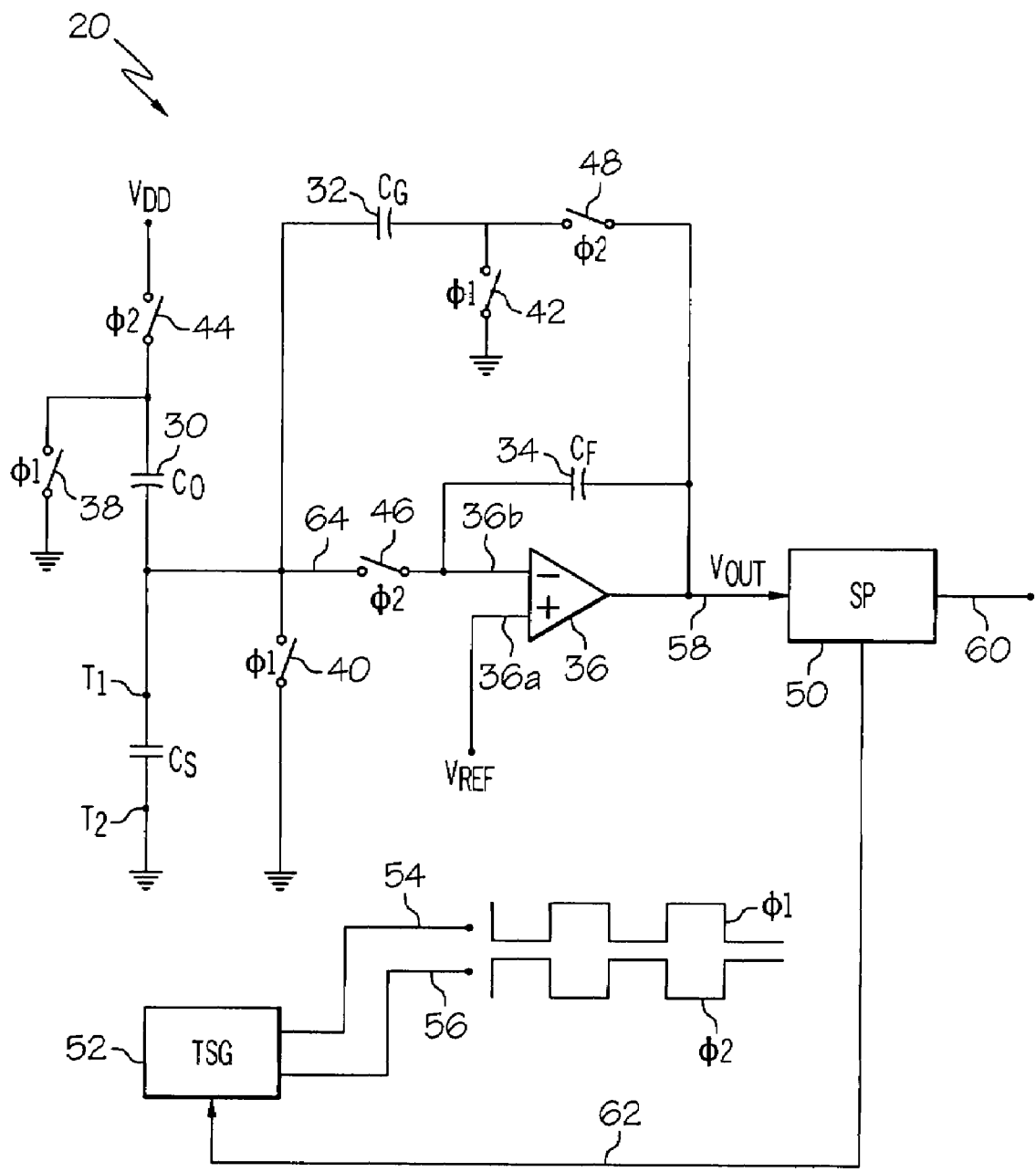
FIG. 2 is a circuit diagram of a detection circuit according to this invention for the single element capacitive proximity sensor strip of FIG. 1A, including a digital signal processor (DSP) for processing the measured capacitance.

According to a first aspect of this invention, the detection circuit 20 of FIG. 1A measures the capacitance of sensor 10 with a switched capacitance circuit that operates at a controlled frequency to maintain measurement accuracy in the presence of moisture while minimizing power consumption and electromagnetic radiation. FIG. 2 depicts the detection circuit 20, and FIG. 3 describes the frequency control.

Referring to FIG. 2, the detection circuit 20 includes a pair of terminals T1 and T2 that are electrically coupled to the conductors 18 and 12, respectively, of sensor strip 10. The capacitor $C_S$ represents the capacitance between the sensor conductors 12 and 18, and is not a component of the detection circuit 20, per se. The components of detection circuit 20 include an offset capacitor ($C_O$) 30, a gain capacitor ($C_G$) 32, a filter capacitor ($C_F$) 34, an operational amplifier 36, several solid-state switches 38-48, a signal processor (SP) 50, and a timing signal generator (TSG) 52. The solid-state switches 38-48 are illustrated as idealized on/off switches, and open and close based on a pair of timing signals Φ1 and Φ2 developed by timing signal generator 52 on lines 54 and 56. Switches 38, 40 and 42 are regulated by the state of timing signal Φ1, while switches 44, 46 and 48 are regulated by the state of timing signal Φ2. As indicated by the waveforms in FIG. 2, the timing signals Φ1 and Φ2 are generally complementary but non-overlapping. The detection circuit 20 produces an analog output voltage $V_{OUT}$ on line 58 based on the sensor capacitance $C_S$. Signal processor 50 includes a low-pass filter for filtering $V_{OUT}$, an analog-to-digital converter for converting the filter output to a digital format, and a digital signal processor (DSP) for analyzing the measured capacitance and producing an object detection status output on line 60 for indicating the presence or absence of an object in proximity to the sensor strip 10. Additionally, the signal processor 50 outputs a frequency control signal on line 62 for regulating the frequency of the timing signals Φ1 and Φ2 produced by timing signal generator 52.

The analog output voltage $V_{OUT}$ is developed at the output of operational amplifier 36 based on a reference voltage $V_{REF}$ supplied to its non-inverting input 36a and the switched voltage applied to its inverting input 36b. The filter capacitor 34 is always coupled between the inverting input 36b and the output line 58. During each high state of timing signal Φ2, the sensor capacitance $C_S$ and the capacitors 30 and 32 are charged through switches 44 and 48 to develop a detection voltage on line 58. During the succeeding high state of timing signal Φ1, switch 46 isolates the inverting input 36b of operational amplifier 36, and switches 38, 40 and 42 discharge the sensor capacitance $C_S$ and the capacitors 30 and 32. The output $V_{OUT}$ is a function of the supply voltage $V_{DD}$, the reference voltage $V_{REF}$, and the capacitances $C_S$, $C_O$ and $C_G$. Preferably, $V_{DD}$ is a multiple of $V_{REF}$, allowing $V_{OUT}$ to be expressed as a function of just $V_{REF}$, $C_S$, $C_O$ and $C_G$ as follows:

$$V_{OUT} = V_{REF} * (C_S - C_O)/C_G$$

The offset capacitance $C_O$ is preferably equal to the nominal capacitance of the sensor strip 10, so that changes in the fringing capacitance due to an object in proximity to the sensor strip 10 strongly affect the difference ($C_S - C_O$), which in turn, directly influences $V_{OUT}$.

Preferably, and as mentioned above, timing signal generator 52 is configured to be frequency selectable, enabling signal processor 50 to control the frequency of the timing signals Φ1 and Φ2. In the illustrated embodiment, timing signal generator 52 generates the timing signals Φ1 and Φ2 at a calibrated low frequency $F_{LOW}$ (such as 10 KHz) or a calibrated high frequency $F_{HIGH}$ (such as 5 MHz), depending on the digital state the frequency control signal on line 62. The purpose of this capability is to ensure reliable measurement of the sensor capacitance $C_S$ when there is moisture on sensing strip 10, while maintaining the timing signal frequency as low as possible for low radiated emissions when sensor moisture is not at issue. In general, moisture on the sensor strip 10 forms an unwanted parasitic capacitance between conductor 18 and ground plane conductor 12 (as well as mounting surface 14) having a time constant $\tau_m$ based on the resistance and effective capacitance of the moisture. While the time constant $\tau_m$ is appreciably smaller than the period of $F_{LOW}$, it is appreciably larger than the period of $F_{HIGH}$. Consequently, the moisture discharge path significantly influences output voltage $V_{OUT}$ when the timing signal frequency is $F_{LOW}$, but not when the timing signal frequency is $F_{HIGH}$.

Figure 3:
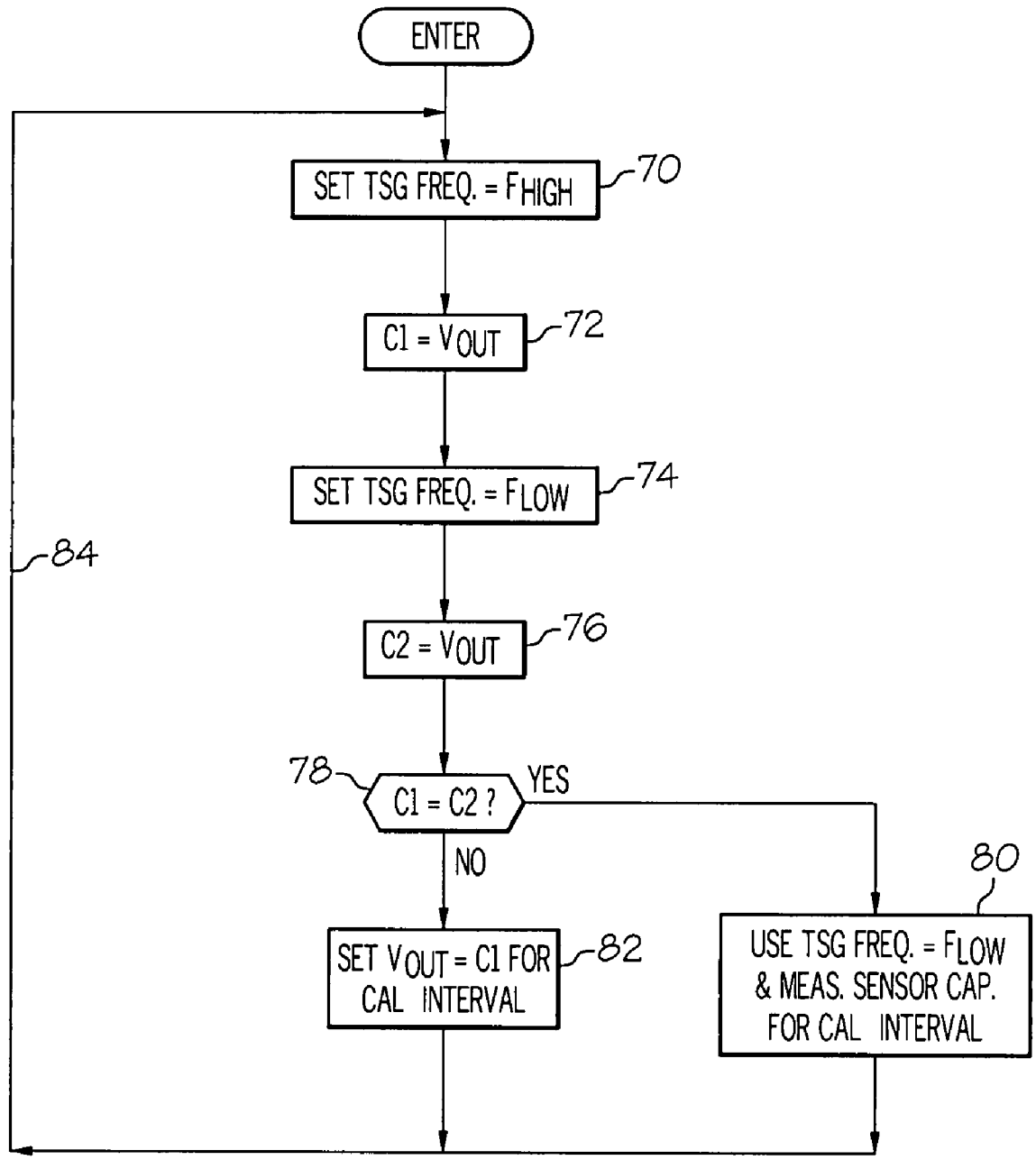
FIG. 3 is a flow diagram representative of a timing signal frequency control carried out by the DSP of FIG. 2 according to this invention.

The flow diagram of FIG. 3 represents a routine carried out by the DSP of signal processor 50 for regulating the operating frequency of timing signal generator 52 in an manner to ensure reliable measurement of the sensor capacitance $C_S$ in the presence of moisture, while minimizing radiated emissions due to the operation of the switches 38-48 controlled by timing signals Φ1 and Φ2. Referring to FIG. 3, the blocks 70 and 72 initially set the timing signal frequency to $F_{HIGH}$ for a sampling interval, and store the resulting capacitance measurement as C1. Then blocks 74 and 76 set the timing signal frequency to $F_{LOW}$ for a sampling interval, and store the resulting capacitance measurement as C2. Block 78 compares the capacitance measurements C1 and C2. If C1 and C2 are substantially equivalent, sensor moisture is not present, and block 80 allows the detection circuit to continue reliable capacitance measurement at the low frequency $F_{LOW}$ for a calibrated interval (CAL_INTERVAL) such as 10 seconds. If C1 and C2 are not substantially equivalent, sensor moisture is present, and block 82 retains the reliable high frequency capacitance measurement C1 for the calibrated interval. Following the calibrated interval, the process is repeated as indicated by flow line 84. As a result, radiated emissions are minimized by minimizing switching operation at $F_{HIGH}$, reliable capacitance measurement is ensured regardless of sensor moisture, and the detection circuit power consumption is minimized in the presence of sensor moisture.

Figure 4:
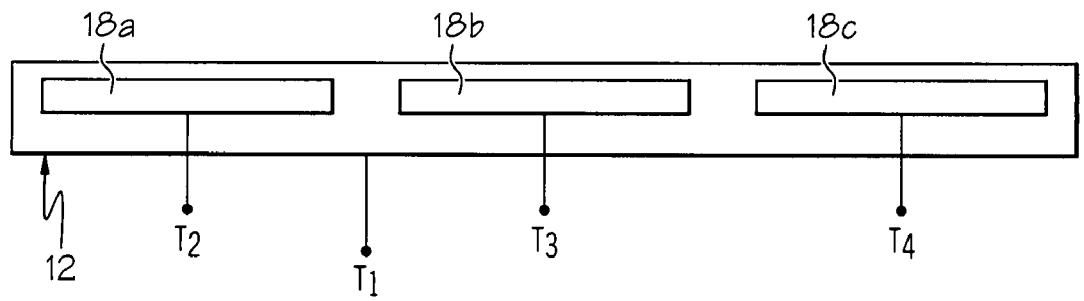
FIG. 4 is a diagram of a multi-element capacitive proximity sensor strip according to this invention.
Figure 5B:
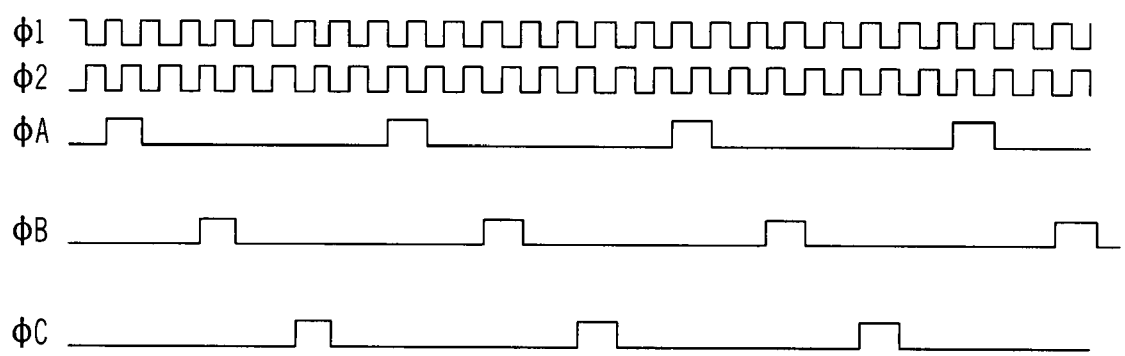
FIG. 5B is a graph depicting timing signals for the detection circuit of FIG. 5A.
Figure 5A:
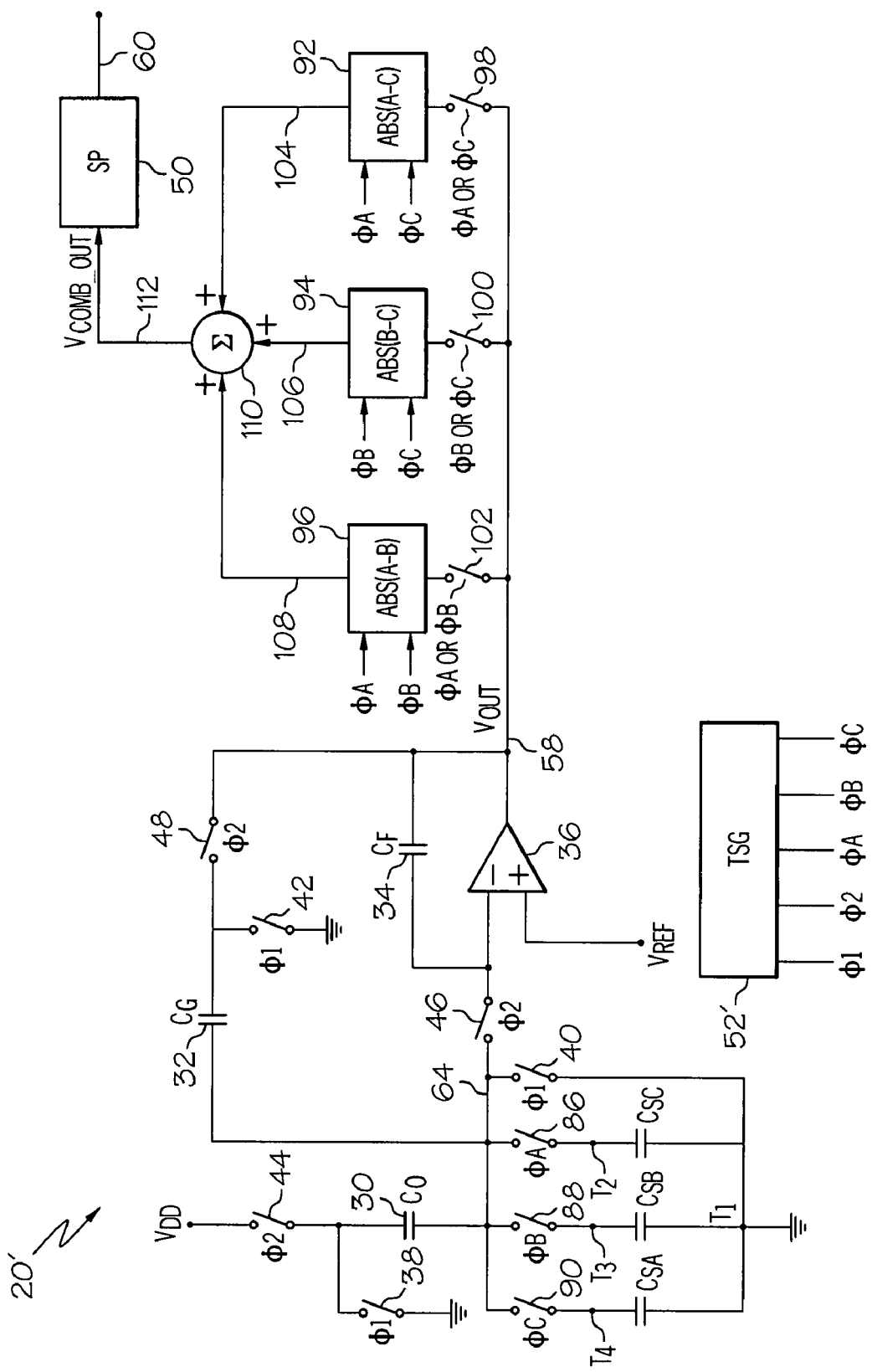
FIG. 5A is a circuit diagram of a detection circuit according to this invention for the multi-element capacitive proximity sensor strip of FIG. 4.

FIGS. 4 and 5A-5B pertain to an embodiment in which the narrow flexible conductor 18 of sensor strip 10 is divided into multiple segments along its length to form a multi-element capacitive proximity sensor. Such a sensor is depicted in FIG. 4 and is generally designated by the reference numeral 10'. In the embodiment of FIG. 4, the sensor strip 10' comprises a series of three electrically isolated narrow conductor segments 18a, 18b and 18c. The detection circuit 20' of FIG. 5A is electrically coupled to the ground plane conductor 12 at terminal T1, and to the conductor segments 18a, 18b and 18c at terminals T2, T3 and T4, respectively. As explained below, the use of such a multi-element sensor strip is particularly advantageous because the detection circuit 20' can be configured to measure capacitance in a way that cancels out common-mode variations due to sensor moisture, temperature, and even sensor aging. FIG. 5A depicts the detection circuit 20', and FIG. 5B depicts the timing signals utilized by the circuit.

The detection circuit 20' essentially uses the switched capacitance circuit elements of detection circuit 20 to measure and sample each of the three sensor strip capacitances, designated in FIG. 5A as $C_{SA}$, $C_{SB}$ and $C_{SC}$. Sensor capacitance $C_{SA}$ is the capacitance between sensor terminals T1 and T2; sensor capacitance $C_{SB}$ is the capacitance between sensor terminals T1 and T3; and sensor capacitance $C_{SC}$ is the capacitance between sensor terminals T1 and T4. In general, the reference numerals from FIG. 2 have been re-used to designate identical or corresponding components in FIG. 5A. For example, switches 38-42 are regulated by the state of timing signal Φ1, while switches 44-48 are regulated by the state of timing signal Φ2, which is complementary but non-overlapping with respect to timing signal Φ1. The additional switches 86, 88 and 90 are controlled by a set of staggered timing signals ΦA, ΦB and ΦC, respectively, to individually and successively couple the circuit line 64 to the sensor strip terminals T2, T3 and T4. The timing signals Φ1 and Φ2, as well as the staggered timing signals ΦA, ΦB and ΦC, are developed by the timing signal generator (TSG) 52', and are graphically depicted in FIG. 5B.

Detection circuit 20' additionally includes a set of three absolute value difference circuits 92, 94, 96, each having an input connected to line 58 through a controlled switch 98, 100, 102 for selective sampling of the output voltage $V_{OUT}$ at the output of operational amplifier 36. The circuits 92-96 and the switches 98-102 utilize the timing signals ΦA, ΦB and ΦC as shown so that circuits 92-98 output the indicated voltage differences. That is, circuit 92 forms an output on line 104 equal to twice the absolute value of the difference $(V_{OUT\_A} - V_{OUT\_C})$, where $V_{OUT\_A}$ is the output voltage $V_{OUT}$ corresponding to sensor capacitance $C_{SA}$ and $V_{OUT\_C}$ is the output voltage $V_{OUT}$ corresponding to sensor capacitance $C_{SC}$. Similarly, circuit 94 forms an output on line 106 equal to twice the absolute value of the difference $(V_{OUT\_B} - V_{OUT\_C})$, where $V_{OUT\_C}$ is the output voltage $V_{OUT}$ corresponding to sensor capacitance $C_{SC}$, and circuit 96 forms an output on line 108 equal to twice the absolute value of the difference $(V_{OUT\_A} - V_{OUT\_B})$. The output voltages on lines 104, 106 and 108 are summed by summing circuit 110 to form combined output voltage $V_{COMB\_OUT}$ on line 112 as follows:

$$V_{COMB\_OUT} = 2|(V_{OUT\_A} - V_{OUT\_C})| + 2|(V_{OUT\_B} - V_{OUT\_C})| + 2|(V_{OUT\_A} - V_{OUT\_B})|$$

The combined output voltage $V_{COMB\_OUT}$ on line 112 is applied as an input to signal processor 50, which includes a low-pass filter, an analog-to-digital converter for converting the filter output to a digital format, and a digital signal processor (DSP) for analyzing the capacitance measurement and producing an object detection status output on line 60 for indicating the presence or absence of an object in proximity to the sensor strip 10. Of course, the output voltage $V_{OUT}$ of operational amplifier 36 can be converted to a digital signal prior to application to circuits 92, 94 and 96, if desired. By analyzing the sum of the absolute value of the differences of $V_{OUT\_A}$, $V_{OUT\_B}$ and $V_{OUT\_C}$ (i.e, $V_{COMB\_OUT}$), the signal processor 50 is responsive to changes in the fringing capacitance of any sensor element of the strip 10'. More importantly, all common-mode variation due to factors such as sensor moisture, temperature and sensor aging are cancelled out.

In summary, the present invention provides an improved capacitance detection circuit responsive to changes in the fringing capacitance of a capacitive proximity sensor. The detection circuit includes a switched capacitance circuit that samples the sensor capacitance, and can be utilized with capacitive sensors having a single sensor element or multiple sensor elements. If the proximity sensor has a single sensor element, the operating frequency of the detection circuit is controlled to maintain measurement accuracy in the presence of sensor moisture while minimizing the circuit's power consumption and electromagnetic radiation. If the proximity sensor has multiple sensor elements, the sampled capacitance values are differenced, absolute-valued and summed to form an output that is insensitive to common-mode environmental and aging factors that influence the capacitance of the sensor elements.

While the present invention has been described with respect to the illustrated embodiment, it is recognized that numerous modifications and variations in addition to those mentioned herein will occur to those skilled in the art. For example, the invention can be used with any number of sensing elements, the ground-plane conductor 12 can be omitted as mentioned above, the detection circuits 20, 20' can be fully differential instead of single-ended, the signal detection may be implemented in the current domain instead of the voltage domain, and so forth. Accordingly, it is intended that the invention not be limited to the disclosed embodiment, but that it have the full scope permitted by the language of the following claims.

The invention claimed is:

1. A capacitance detection apparatus for a capacitive proximity sensor having at least one sensing element, comprising:
    a switching means for alternately charging and discharging said sensing element;
    an operational amplifier responsive to a detection voltage developed during the charging of said sensing element for developing an output voltage that varies in relation to a capacitance of said sensing element;
    a detection means responsive to said output voltage for detecting the capacitance of said sensing element; and
    a timing signal generator for developing timing signals for timing the alternate charging and discharging of said sensing element, where said detection means controls a frequency of the timing signals produced by said timing signal generator so that the detected capacitance is substantially insensitive to capacitive effects due to moisture on said sensor.

2. The capacitance detection apparatus of claim 1, where:
    said sensing element is charged in series with an offset capacitor; and
    said detection voltage is developed at a junction between said sensing element and said offset capacitor so that the output voltage of said operational amplifier varies in relation to a difference between the capacitance of said sensing element and a capacitance of said offset capacitor.

3. The capacitance detection apparatus of claim 1, where:
    said detection means detects moisture on said sensor when the detected capacitance changes with the frequency of said timing signals.

4. The capacitance detection apparatus of claim 3, where:
    said detection means periodically changes the frequency of said timing signals to determine if there is moisture on said sensor.

5. The capacitance detection apparatus of claim 3, where:
    said detection means controls the frequency of said timing signals to a first calibrated value that makes the detected capacitance substantially insensitive to the capacitive effects of moisture in response to the detection of moisture on said sensor.

6. The capacitance detection apparatus of claim 5, where:
    said detection means detects an absence of moisture on said sensor when the detected capacitance is not substantially affected by the frequency of said timing signals, and controls the frequency of said timing signals to a second calibrated value lower than said first calibrated value.

7. The capacitance detection apparatus of claim 5, where:
    said detection means periodically suspends the alternate charging and discharging of said sensing element after detecting the capacitance of said sensing element with said timing signals controlled to said first calibrated value.

8. A capacitance detection apparatus for a capacitive proximity sensor having at least one sensing element, comprising:
    switching means for alternately charging and discharging said sensing element;
    an operational amplifier responsive to a detection voltage developed during the charging of said sensing element for developing an output voltage that varies in relation to a capacitance of said sensing element;
    detection means responsive to said output voltage for detecting the capacitance of said sensing element; said detection means controls a frequency associated with timing signals generated by a timing signal generator and said frequency selected and generated by the timing signal generator is set to a first calibrated value that makes the detected capacitance substantially insensitive to the capacitive effects of moisture in response to the detection of moisture on said sensor.

9. The capacitance detection apparatus of claim 8, where:
    said detection means detects an absence of moisture on said sensor when the detected capacitance is not substantially affected by the frequency of said timing signals, and controls the frequency of said timing signals to a second calibrated value lower than said first calibrated value.

10. The capacitance detection apparatus of claim 8, where:
said detection means periodically suspends the alternate charging and discharging of said sensing element after detecting the capacitance of said sensing element with said timing signals controlled to said first calibrated value.

11. A capacitance detection apparatus for a capacitive proximity sensor having a plurality of different sensing elements, comprising:
a switching means for alternately charging and discharging each of the different sensing elements in succession;
an operational amplifier responsive to a detection voltage developed during the charging of each of the different sensing elements to produce an output voltage at an output of the operational amplifier that varies in relation to a capacitance of each of the different sensing elements being alternately charged and discharge; and
a detection means includes means for determining absolute value differences in said output voltage among the different sensing elements, and for summing said absolute value differences to form a combined output voltage that is substantially insensitive to capacitive effects due to moisture on said sensor.

12. The capacitance detection apparatus of claim 11, wherein the combined output voltage is substantially insensitive to capacitive effects due to temperature effects on said sensor and substantially insensitive to capacitive effects due to aging effects on said sensor.

* * * * *